United States Patent
Lai et al.

(10) Patent No.: US 6,653,227 B1
(45) Date of Patent: Nov. 25, 2003

(54) METHOD OF COBALT SILICIDATION USING AN OXIDE-TITANIUM INTERLAYER

(75) Inventors: Chung Woh Lai, Singapore (SG); Beichao Zhang, Singapore (SG); Eng Hua Lim, Singapore (SG); Arthur Ang, Singapore (SG); Hai Jiang Peng, Singapore (SG); Charles Lin, Fremont, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/651,963

(22) Filed: Aug. 31, 2000

(51) Int. Cl.[7] ............................................. H01L 21/4763
(52) U.S. Cl. ...................... 438/633; 438/706; 438/712; 438/719
(58) Field of Search ................. 438/590, 591, 438/592, 593, 663, 664, 586, 587, 712, 719, 706, 713

(56) References Cited

U.S. PATENT DOCUMENTS

| | | | |
|---|---|---|---|
| 5,047,367 A | * 9/1991 | Wei et al. | 437/200 |
| 5,736,461 A | 4/1998 | Berti et al. | 438/651 |
| 5,950,098 A | 9/1999 | Oda et al. | 438/527 |
| 5,970,370 A | * 10/1999 | Besser et al. | 438/586 |
| 5,989,988 A | * 11/1999 | Iinuma et al. | 438/592 |
| 6,004,879 A | 12/1999 | Hu et al. | 438/682 |
| 6,022,457 A | 2/2000 | Huang et al. | 204/192.17 |
| 6,037,254 A | 3/2000 | Hong | 438/651 |
| 6,238,986 B1 | * 5/2001 | Kepler et al. | 438/301 |
| 6,281,102 B1 | * 8/2001 | Cao et al. | 438/592 |
| 6,300,239 B1 | * 10/2001 | Ono | 438/633 |

OTHER PUBLICATIONS

Wolf et al.; Silicon Processing for the VLSI Era; 1986; vol. 1; p. 198–241.*

* cited by examiner

Primary Examiner—Benjamin L. Utech
Assistant Examiner—Duy-Vu Deo
(74) Attorney, Agent, or Firm—George O. Saile; Rosemary L. S. Pike

(57) ABSTRACT

A new method for forming a high quality cobalt disilicide film in the fabrication of an integrated circuit is described. A semiconductor substrate is provided having silicon regions to be silicided. A thermal oxide layer is grown overlying the semiconductor substrate. A titanium layer is deposited overlying the thermal oxide layer. A cobalt layer is deposited overlying the titanium layer. A titanium nitride capping layer is deposited over the cobalt layer. The substrate is subjected to a first rapid thermal anneal whereby the cobalt is transformed to cobalt monosilicide where it overlies the silicon regions and wherein the cobalt not overlying the silicon regions is unreacted. The unreacted cobalt layer and the capping layer are removed. The substrate is subjected to a second rapid thermal anneal whereby the cobalt monosilicide is transformed to cobalt disilicide to complete formation of a cobalt disilicide film in the manufacture of an integrated circuit.

21 Claims, 3 Drawing Sheets

METHOD OF COBALT SILICIDATION USING AN OXIDE-TITANIUM INTERLAYER

BACKGROUND OF THE INVENTION (1) Field of the Invention

The invention relates to the fabrication of integrated circuit devices, and more particularly, to a method of forming a high quality cobalt silicide film in the fabrication of integrated circuits.

(2) Description of the Prior Art

Cobalt disilicide ($CoSi_2$) is a preferred salicide technology as CMOS device sizes shrink to 0.18 $\mu m$ and beyond because of its good performance with small polysilicon and active area line widths. One of the main pursuits in Co silicidation is to obtain a $CoSi_2$ film with high quality to meet the requirement of low junction leakage. As transistor size is further scaled down, this requirement will become more stringent. Hence, new approaches need to be explored towards this purpose. It has been reported that an interlayer of thin silicon oxide between the cobalt and the silicon substrate plus a titanium cap layer can form a diffusion membrane between the Co film and the silicon, thereby enhancing an epitaxial growth of $CoSi_2$ film and therefore, elevating $CoSi_2$ film quality.

U.S. Pat. No. 6,037,254 to Hong discloses a silicon oxide layer underlying the cobalt layer, as discussed above. U.S. Pat. No. 5,710,438 to Oda et al teaches an ion implant into cobalt before annealing to remove the native oxide film underlying the cobalt layer. U.S. Pat. No. 6,022,457 to Huang et al discloses cleaning the native oxide layer off the silicon substrate, then depositing a titanium layer under the cobalt layer. A silicon layer may be deposited over the titanium layer and under the cobalt layer. U.S. Pat. No. 5,736,461 to Berti et al teaches a titanium nitride or titanium tungsten capping layer over the cobalt. U.S. Pat. No. 6,004,879 to Hu et al discloses sputtering $CoSi_xO_y$ in order to form cobalt silicide.

SUMMARY OF THE INVENTION

A principal object of the present invention is to provide an effective and very manufacturable method of fabricating a cobalt disilicide film in the fabrication of an integrated circuit.

A further object of the invention is to provide a method of fabricating a high quality cobalt disilicide film in the fabrication of an integrated circuit.

Yet another object is to provide a method of forming a high quality cobalt disilicide film by using an oxide-titanium underlayer.

Yet another object is to provide a method of forming a high quality cobalt disilicide film by using an oxide-titanium underlayer and a titanium nitride capping layer.

In accordance with the objects of the invention a method for forming a high quality cobalt disilicide film in the fabrication of an integrated circuit is achieved. A semiconductor substrate is provided having silicon regions to be silicided. A thermal oxide layer is grown overlying the semiconductor substrate. A titanium layer is deposited overlying the thermal oxide layer. A cobalt layer is deposited overlying the titanium layer. A titanium nitride capping layer is deposited over the cobalt layer. The substrate is subjected to a first rapid thermal anneal whereby the cobalt is transformed to cobalt monosilicide where it overlies the silicon regions and wherein the cobalt not overlying the silicon regions is unreacted. The unreacted cobalt layer and the capping layer are removed. The substrate is subjected to a second rapid thermal anneal whereby the cobalt monosilicide is transformed to cobalt disilicide to complete formation of a cobalt disilicide film in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a cobalt disilicide film overlying a silicon region. The process of the invention will be described for the application in which $CoSi_2$ is formed overlying a gate electrode and source and drain regions. It is to be understood that the invention is not limited to the application so illustrated.

Figure 1:
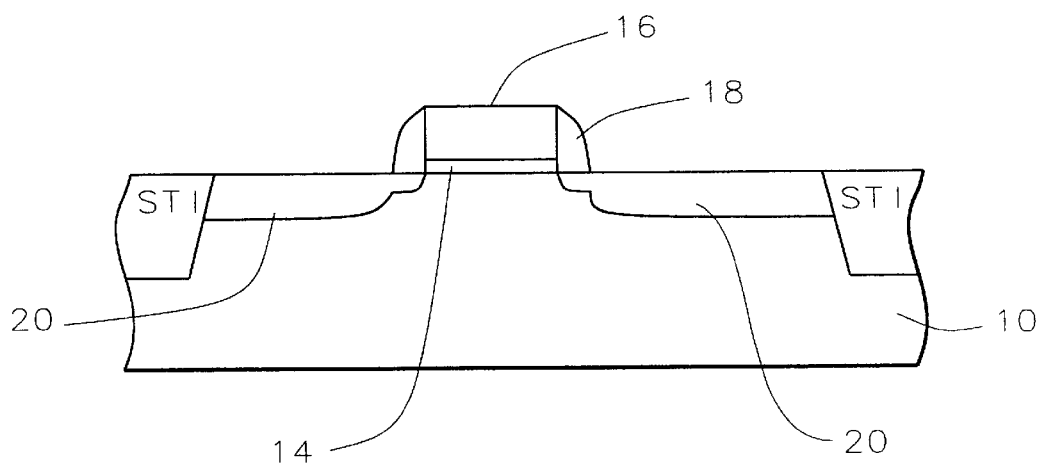
FIGS. 1 through 4 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Gate electrode 16 and source and drain regions 20 are formed in and on the semiconductor substrate as is conventional in the art. For example, gate electrode 16 has been formed overlying a gate oxide layer 14. Sidewall spacers, such as silicon oxide, 18 are formed on the gate. Source and drain regions are n-type or p-type, depending on the type of device to be fabricated.

Figure 2:
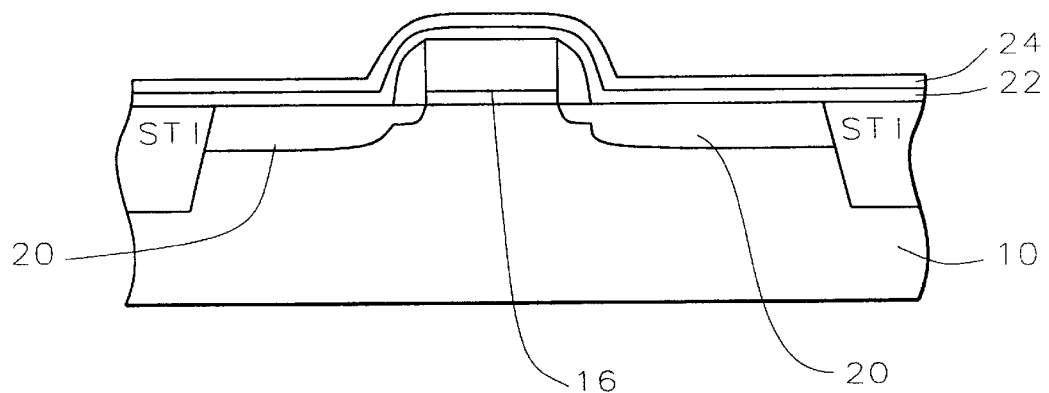

As shown in FIG. 2, a very thin layer of thermal oxide 22 is grown on the silicon substrate and overlying the gate electrode. This thin oxide layer has a thickness of between about 10 and 30 Angstroms. It will be understood that the thickness of the layer 22 has been exaggerated in the figures for clarity.

Next, a thin titanium layer 24 is sputter deposited over the thin oxide layer 22 to a thickness of between about 30 and 100 Angstroms. Layers 22 and 24 form a diffusion membrane layer over the silicon and underlying the cobalt layer to be subsequently deposited.

In the prior art, any oxide layer under cobalt is avoided or eliminated. Titanium has dual roles of diffusion barrier and oxide gettering. In the process of the present invention, the thermal oxide layer is deliberately formed and is desired. The oxide layer reacts with the titanium interlayer to form a diffusion membrane. Moreover, a certain ratio of titanium to oxide is required to form a high quality $CoSi_2$ film for a given thickness of oxide.

Figure 3:
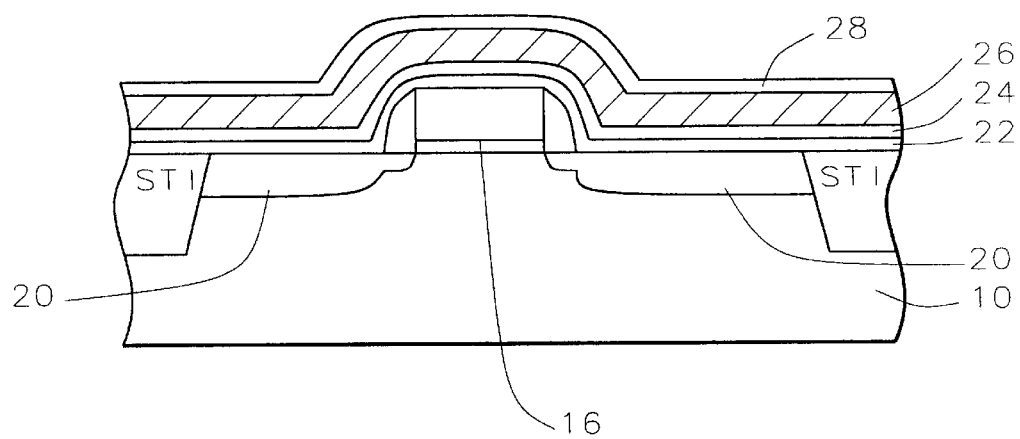

Referring now to FIG. 3, a layer of cobalt 26 is sputter deposited over the titanium layer to a thickness of between about 80 and 170 Angstroms. Next, a capping layer of titanium nitride 28 is deposited over the cobalt layer to a thickness of between about 100 and 250 Angstroms. The titanium nitride capping layer will prevent any foreign contaminant invasion during the first annealing process. A titanium capping layer would result in additional consumption of cobalt to form CoTi compounds during the first annealing process. The titanium nitride capping layer prevents this additional consumption of cobalt and also leads to a lower annealing temperature required compared to that required when the capping layer comprises titanium.

Figure 4:
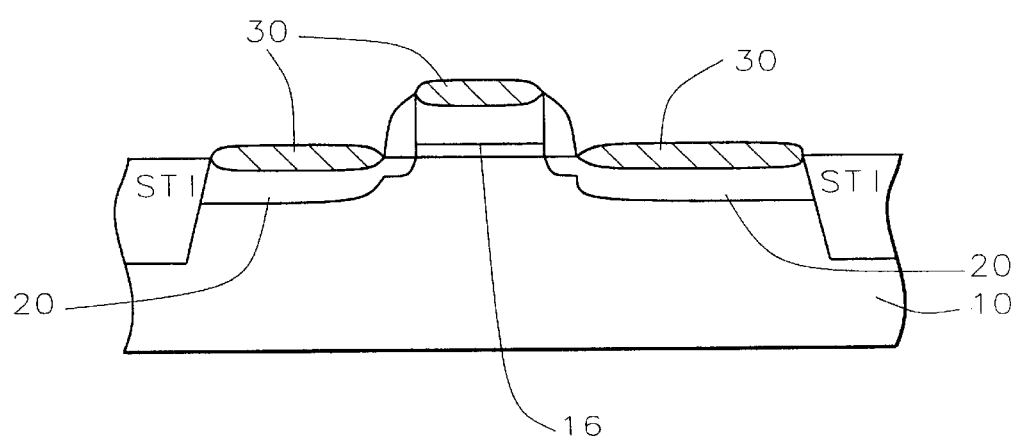

Now, the wafer is subjected to a first rapid thermal annealing (RTA) at a higher than conventional temperature of between about 650 and 775° C. and preferably of about 700° C. for 30 to 60 seconds. This annealing will form cobalt monosilicide (CoSi) 30 over the gate electrode and over the source and drain regions, as shown in FIG. 4. The high temperature annealing will enable controlled diffusion of cobalt through the diffusion membrane of $Ti_xSi_yO_z$, formed by the titanium and silicon oxide underlayers 22/24. The controlled diffusion slows down the inter-diffusion flux rate between cobalt and silicon atoms to allow an epitaxial alignment of $CoSi_2$ film with the silicon substrate. During the first RTA, a chemical compound of $Ti_xSi_yO_z$ will be formed as a diffusion membrane. This diffusion membrane will be removed at the later etchback step.

The titanium nitride capping layer and the unreacted cobalt layer are stripped from the wafer surface, leaving the CoSi film 30 over the gate electrode 16 and the source and drain regions 20, as shown in FIG. 4. This etchback step also removes the $Ti_xSi_yO_z$ diffusion membrane.

To complete the low resistance cobalt silicide film formation, the wafer is subjected to a second RTA, this time at a temperature of between about 750 and 850° C., to transform the cobalt monosilicide (CoSi) to cobalt disilicide ($CoSi_2$).

Figure 5:
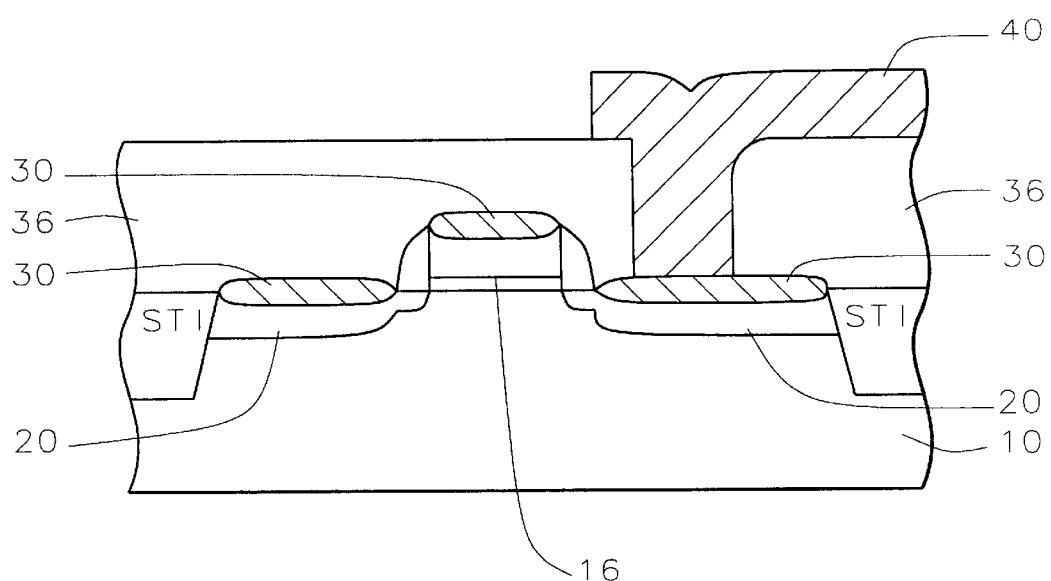
FIG. 5 schematically illustrates in cross-sectional representation a completed integrated circuit fabricated according to a preferred embodiment of the present invention.

Standard backend processing continues as is conventional to complete the integrated circuit. For example, FIG. 5 shows a thick dielectric layer 36 covering the silicided gate and source and drain regions. Electrical connections may be made, for example, to one of the silicided source/drain regions 20 by metal contact 40, as shown.

An X-ray diffraction (XRD) analysis of the $CoSi_2$ formed using the process of the invention shows a silicide formed with "epitaxial" quality, which is very high quality. Also, surface roughness of this salicide film is lower than surface roughness of a salicide film formed without the oxide-titanium interlayer.

The process of the invention provides an effective method of forming $CoSi_2$ especially for shallow junctions and small feature sizes by use of an oxide-titanium interlayer. This interlayer benefits the diffusion membrane formation and provides better control of the cobalt-silicon inter-diffusion. The titanium nitride capping layer prevents any foreign contaminant invasion during the first RTA process.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a cobalt disilicide film in the manufacture of an integrated circuit comprising:
   providing a semiconductor substrate having silicon regions to be silicided;
   growing a thermal oxide layer overlying said semiconductor substrate wherein said thermal oxide layer is deliberately formed;
   depositing a titanium layer overlying said thermal oxide layer wherein said thermal oxide layer and said titanium layer together form a diffusion membrane overlying said silicon regions;
   depositing a cobalt layer overlying said titanium layer;
   depositing a titanium nitride capping layer overlying said cobalt layer;
   subjecting said substrate to a first rapid thermal anneal wherein said thermal oxide layer reacts with said titanium layer and said silicon regions to form a $Ti_xSi_yO_z$ diffusion membrane wherein said cobalt diffuses through said diffusion membrane in a controlled manner wherein composition and thickness of said diffusion membrane is known and whereby said cobalt is transformed to cobalt monosilicide where it overlies said silicon regions and wherein said cobalt not overlying said silicon regions is unreacted;
   removing said unreacted cobalt layer; and
   thereafter subjecting said substrate to a second rapid thermal anneal whereby said cobalt monosilicide is transformed to cobalt disilicide to complete formation of said cobalt disilicide film in the manufacture of said integrated circuit.

2. The method according to claim 1 wherein said silicon regions to be silicided comprise gate electrodes and associated source and drain regions.

3. The method according to claim 1 wherein said thermal oxide layer is grown to a thickness of between about 10 and 30 Angstroms.

4. The method according to claim 1 wherein said titanium layer is sputter deposited to a thickness of between about 30 and 100 Angstroms.

5. The method according to claim 1 wherein said cobalt layer is sputter deposited to a thickness of between about 80 and 170 Angstroms.

6. The method according to claim 1 wherein said first rapid thermal anneal is performed at a temperature of between about 650 and 775° C.

7. The method according to claim 1 wherein said capping titanium nitride layer is removed during said step of removing said unreacted cobalt layer.

8. The method according to claim 1 wherein said second rapid thermal anneal is performed at a temperature of between about 750 and 850° C.

9. A method of fabricating a cobalt disilicide film in the manufacture of an integrated circuit comprising:
   providing a semiconductor substrate having silicon regions to be silicided;
   growing a thermal oxide layer to a thickness of between 10 and 30 Angstroms overlying said semiconductor substrate wherein said thermal oxide layer is deliberately formed;
   depositing a titanium layer to a thickness of between 30 and 100 Angstroms overlying said thermal oxide layer wherein said thermal oxide layer and said titanium layer together form a diffusion membrane overlying said silicon regions;
   depositing a cobalt layer overlying said titanium layer;
   depositing a titanium nitride capping layer overlying said cobalt layer;
   subjecting said substrate to a first rapid thermal anneal at a temperature of greater than 650° C. wherein said thermal oxide layer reacts with said titanium layer and said silicon regions to form a $Ti_xSi_yO_z$ diffusion membrane wherein said cobalt diffuses through said diffusion membrane in a controlled manner wherein composition and thickness of said diffusion membrane is known and whereby said cobalt is transformed to cobalt monosilicide where it overlies said silicon regions and wherein said cobalt not overlying said silicon regions is unreacted;

removing said unreacted cobalt layer; and thereafter subjecting said substrate to a second rapid thermal anneal whereby said cobalt monosilicide is transformed to cobalt disilicide to complete formation of said cobalt disilicide film in the manufacture of said integrated circuit.

10. The method according to claim 9 wherein said silicon regions to be silicided comprise gate electrodes and associated source and drain regions.

11. The method according to claim 9 wherein said cobalt layer is sputter deposited to a thickness of between about 80 and 170 Angstroms.

12. The method according to claim 9 wherein said capping titanium nitride layer is removed during said step of removing said unreacted cobalt layer.

13. The method according to claim 9 wherein said second rapid thermal anneal is performed at a temperature of between about 750 and 850° C.

14. A method of fabricating a cobalt disilicide film in the manufacture of an integrated circuit comprising:

providing a semiconductor substrate having silicon regions to be silicided;

growing a thermal oxide layer overlying said semiconductor substrate wherein said thermal oxide layer is deliberately formed;

depositing a titanium layer overlying said thermal oxide layer wherein said thermal oxide layer and said titanium layer together form a diffusion membrane overlying said silicon regions;

depositing a cobalt layer overlying said titanium layer;

depositing a titanium nitride capping layer overlying said cobalt layer;

subjecting said substrate to a first rapid thermal anneal at a temperature of greater than 650° C. wherein said thermal oxide layer reacts with said titanium layer and said silicon regions to form a $Ti_xSi_yO_z$ diffusion membrane wherein said titanium nitride capping layer prevents contamination of said diffusion membrane wherein said cobalt diffuses through said diffusion membrane in a controlled manner wherein composition and thickness of said diffusion membrane is known and whereby said cobalt is transformed to cobalt monosilicide where it overlies said silicon regions and wherein said cobalt not overlying said silicon regions is unreacted;

removing said unreacted cobalt layer and said titanium nitride capping layer; and thereafter subjecting said substrate to a second rapid thermal anneal whereby said cobalt monosilicide is transformed to cobalt disilicide to complete formation of said cobalt disilicide film in the manufacture of said integrated circuit.

15. The method according to claim 14 wherein said silicon regions to be silicided comprise gate electrodes and associated source and drain regions.

16. The method according to claim 14 wherein said thermal oxide layer is grown to a thickness of between about 10 and 30 Angstroms.

17. The method according to claim 14 wherein said titanium layer is sputter deposited to a thickness of between about 30 and 100 Angstroms.

18. The method according to claim 14 wherein said thermal oxide layer and said titanium layer have a combined thickness of between about 40 and 130 Angstroms.

19. The method according to claim 14 wherein said cobalt layer is sputter deposited to a thickness of between about 80 and 170 Angstroms.

20. The method according to claim 14 wherein said titanium nitride capping layer is deposited to a thickness of between about 100 and 250 Angstroms.

21. The method according to claim 14 wherein said second rapid thermal anneal is performed at a temperature of between about 750 and 850° C.

* * * * *